(12) United States Patent
Sugiura (10) Patent No.: US 9,076,855 B2
(45) Date of Patent: Jul. 7, 2015

(54) LASER MACHINING METHOD

(75) Inventor: Ryuji Sugiura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 654 days.

(21) Appl. No.: 13/265,027

(22) PCT Filed: Mar. 19, 2010

(86) PCT No.: PCT/JP2010/054841
§ 371 (c)(1),
(2), (4) Date: Dec. 8, 2011

(87) PCT Pub. No.: WO2010/122866
PCT Pub. Date: Oct. 28, 2010

(65) Prior Publication Data
US 2012/0091107 A1    Apr. 19, 2012

(30) Foreign Application Priority Data
Apr. 20, 2009  (JP) .............................. P2009-101924

(51) Int. Cl.
*B23K 26/38*  (2014.01)
*H01L 21/78*  (2006.01)
*B23K 26/00*  (2014.01)
*B23K 26/40*  (2014.01)
(Continued)

(52) U.S. Cl.
CPC ............ *H01L 21/78* (2013.01); *B23K 26/0057* (2013.01); *B23K 26/4075* (2013.01); *B28D 1/221* (2013.01); *B28D 5/0011* (2013.01); *B23K 2201/40* (2013.01)

(58) Field of Classification Search
CPC .. B23K 26/0003; B23K 26/36; B23K 26/365; B23K 26/367; B23K 26/06; B23K 26/006; B23K 26/38
USPC .............. 219/121.67–121.69, 121.73–121.75
See application file for complete search history.

(56) References Cited

U.S. PATENT DOCUMENTS

| 4,546,231 A | 10/1985 | Gresser et al. |
| 6,992,026 B2 | 1/2006 | Fukuyo et al. |

(Continued)

FOREIGN PATENT DOCUMENTS

| CN | 1160228 A | 9/1997 |
| CN | 101218664 | 7/2008 |

(Continued)

OTHER PUBLICATIONS

U.S. Appl. No. 13/206,181, filed Aug. 9, 2011.
(Continued)

*Primary Examiner* — Brian Jennison
(74) *Attorney, Agent, or Firm* — Drinker Biddle & Reath LLP (57) ABSTRACT

An object to be processed 1 is irradiated with laser light L along a line to cut 5a while locating a converging point within the object 1, so as to form a modified region 7a. Thereafter, the irradiation with the laser light L is performed again along the line 5a, so as to form a modified region 7b between a front face 3 and the first modified region 7a in the object 1 and generate a fracture Cb extending from the modified region 7b to the front face 3. Therefore, a deflecting force F1 occurring when forming the modified region 7a in the object 1 can be released and canceled out by the fracture Cb. As a result, the object 1 can be inhibited from deflecting.

8 Claims, 13 Drawing Sheets

(51) Int. Cl.
*B28D 1/22* (2006.01)
*B28D 5/00* (2006.01)

(56) References Cited

U.S. PATENT DOCUMENTS

| | | | |
|---|---|---|---|
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 * | 3/2011 | Sugiura et al. ............... 438/463 |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 8,043,941 B2 * | 10/2011 | Sugiura et al. ............... 438/463 |
| 8,338,271 B2 * | 12/2012 | Sugiura et al. ............... 438/463 |
| 2004/0002199 A1 | 1/2004 | Fukuyo et al. |
| 2005/0202596 A1 | 9/2005 | Fukuyo et al. |
| 2005/0272223 A1 | 12/2005 | Fujii et al. |
| 2006/0011593 A1 | 1/2006 | Fukuyo et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0004828 A1 | 1/2009 | Kobayashi |
| 2009/0008373 A1 | 1/2009 | Muramatsu et al. |
| 2009/0026185 A1 * | 1/2009 | Sakamoto ............... 219/121.72 |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 * | 1/2011 | Nakano et al. ........... 219/121.72 |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| CN | 101772398 | 7/2010 |
| EP | 1906438 | 4/2008 |
| EP | 1983557 | 10/2008 |
| JP | 2003-338467 | 11/2003 |
| JP | 2008-100284 | 5/2008 |
| JP | 2008-110405 | 5/2008 |
| JP | 2008-213024 | 9/2008 |
| JP | 2009-10105 | 1/2009 |
| JP | 2009-34723 | 2/2009 |
| TW | 200809942 | 2/2008 |
| TW | 200821076 | 5/2008 |
| WO | WO 2009/020004 | 2/2009 |

OTHER PUBLICATIONS

U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
X. Liu et al., "Laser Ablation and Micromachining with Ultrashort Laser Pulses," IEEE Journal of Quantum Electronics, vol. 33, No. 10, Oct. 1997, pp. 1706-1716.

* cited by examiner

LASER MACHINING METHOD

TECHNICAL FIELD

The present invention relates to a laser processing method for cutting an object to be processed.

BACKGROUND ART

Known as a conventional laser processing method is one which irradiates a sheet-like object to be processed with laser light while locating a converging point within the object, so as to form a modified region along a line to cut in the object (see, for example, Patent Literature 1). In such a laser processing method, after forming the modified region, the object is cut along the line from the modified region acting as a cutting start point, so as to be separated into a plurality of chips.

CITATION LIST

Patent Literature

Patent Literature 1: Japanese Patent Application Laid-Open No, 2003-338467

SUMMARY OF INVENTION

Technical Problem

When the modified region is formed in the object in laser processing methods such as the one mentioned above, however, the object may deflect in some cases. In the laser processing in the case (hereinafter referred to as thin fine chip processing) where the object is thin with a thickness of 100 μm while chips to be manufactured have a fine size of 1 mm×1 mm or less in particular, such a deflection occurs remarkably. As a result, the object may be cut (full cut) against intentions, for example.

It is therefore an object of the present invention to provide a laser processing method which can inhibit the object from, deflecting.

Solution to Problem

For achieving the above-mentioned object, the laser processing method in accordance with the present invention is a laser processing method of irradiating a sheet-like object to be processed with laser light while locating a converging point within the object so as to form a modified region in the object, the method comprising a first step of forming a first modified region as the modified region along a first line to cut in the object; and a second step of forming a second modified region as the modified region along the first line between one main face and the first modified region in the object, so as to generate a fracture extending from the second modified region to the one main face after forming the first modified region.

In this laser processing method, the deflecting force generated when forming the first modified region in the object can be canceled out by the fracture generated when forming the second modified region. This can inhibit the object from deflecting.

Preferably, the method further comprises a third step of forming a third modified region as the modified region along a second line to cut intersecting the first line after forming the second modified region. When forming the third modified region in this case, since the above-mentioned operation and effect of inhibiting the object from deflecting is exhibited, an autofocus unit which controls the converging point position of the laser light by following the laser light irradiation surface of the object, for example, can be functioned appropriately. Hence, the third modified region can be formed accurately.

Preferably, the one main face is a laser light entrance surface, while the object includes a functional device disposed on the one main face side, and the first step forms the first modified region, so as to generate a fracture extending from the first modified region to the other main face of the object. When the laser light is thus made incident on the object provided with a functional device on the one main face side from the one main face side (i.e., in the case of so-called front illumination), a fracture extending to the other main face may be generated in order to cut the object easily and accurately.

Advantageous Effects of Invention

The present invention can inhibit the object from deflecting.

DESCRIPTION OF EMBODIMENTS

In the following, preferred embodiments of the present invention will be explained in detail with reference to the drawings. In the drawings, the same or equivalent constituents will be referred to with the same signs while omitting their overlapping explanations.

The laser processing method in accordance with an embodiment irradiates an object to be processed with laser light while locating a converging point within the object, so as to form a modified region in the object. Therefore, the forming of the modified region by the laser processing method in accordance with this embodiment will firstly be explained in the following with reference to FIGS. 1 to 6.

Figure 1:
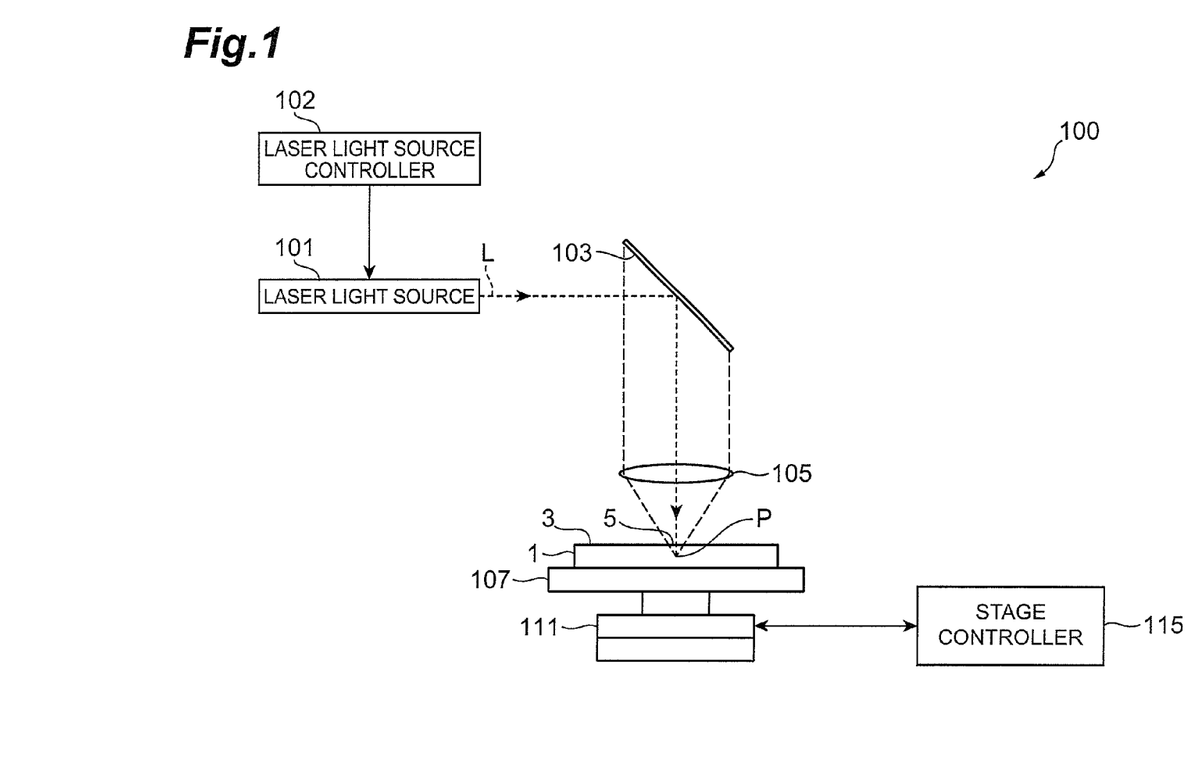
FIG. 1 is a schematic structural diagram of a laser processing device for performing the laser processing method in accordance with an embodiment.

As illustrated in FIG. 1, a laser processing device 100 for performing the laser processing method in accordance with this embodiment is known as so-called SDE (Stealth Dicing Engine, a registered trademark) and comprises a laser light source 101 for pulse-oscillating laser light L, a dichroic mirror 103 arranged so as to change the direction of the optical axis (optical path) of the laser light L by 90°, and a condenser lens (condenser optical system) 105 for converging the laser light L.

The laser processing device 100 also comprises a support table 107 for supporting an object to be processed 1 which is irradiated with the laser light L converged by the condenser lens 105, a stage 111 for moving the support table 107 along X, Y, and Z axes and in a direction θ about the Z axis, a laser light source controller 102 for controlling the laser light source 101 in order to adjust the output, pulse width, and the like of the laser light L, and a stage controller 115 for regulating the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region in the object 1 along the line 5.

The laser processing device 100 is equipped with an undepicted autofocus unit in order to accurately converge the laser light at a predetermined position within the object 1 and form the modified region without being influenced by the surface form of the object 1. As a consequence, the laser light L is controlled in the laser processing device 100 such as to converge at a fixed position from the front or rear face of the object 1, for example.

Figure 2:
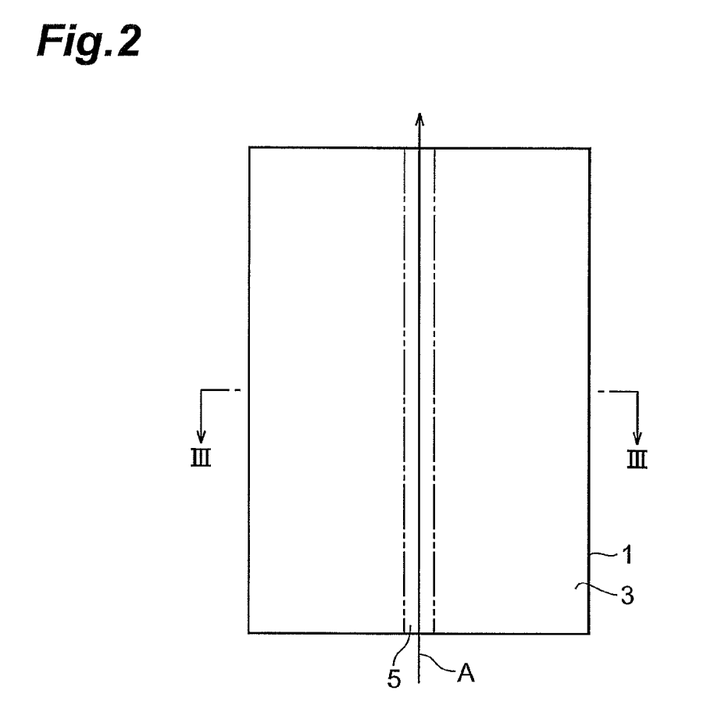
FIG. 2 is a plan view illustrating an example of objects to be processed in which a modified region is to be formed.
Figure 3:
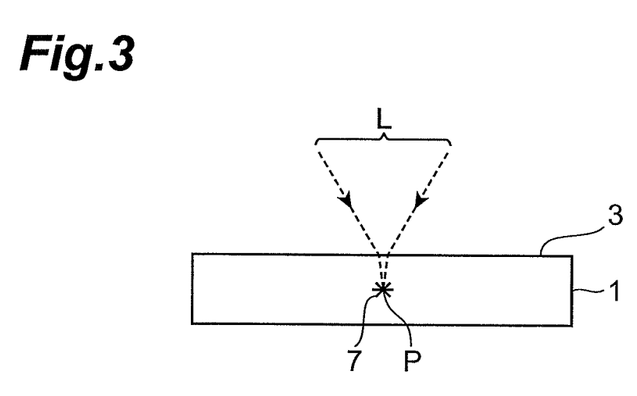
FIG. 3 is a sectional view of the object taken along the line III-III of FIG. 2.
Figure 4:
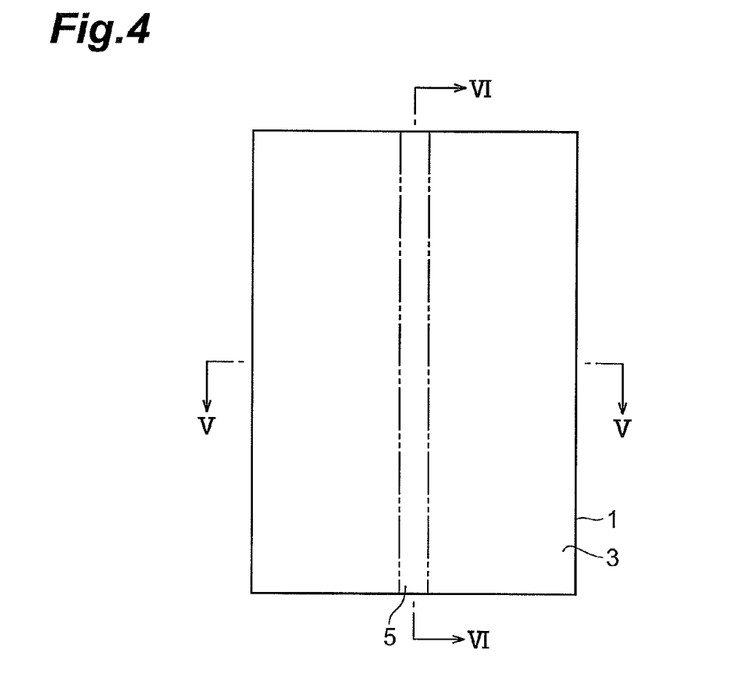
FIG. 4 is a plan view of the object after laser processing.
Figure 5:
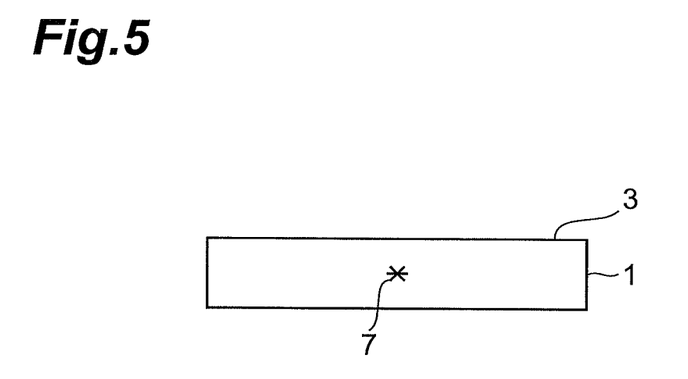
FIG. 5 is a sectional view of the object taken along the line V-V of FIG. 4.
Figure 6:
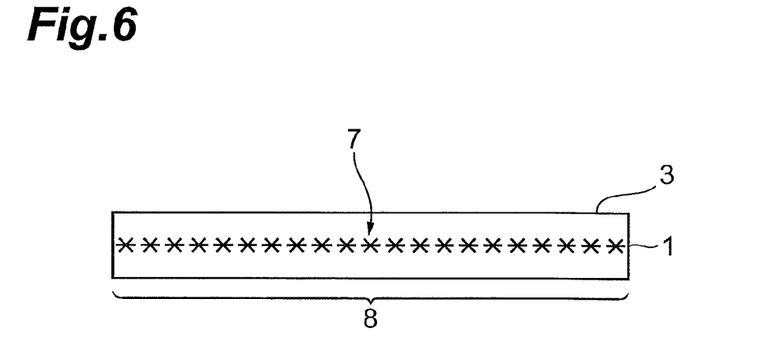
FIG. 6 is a sectional view of the object taken along the line VI-VI of FIG. 4.

As illustrated in FIG. 2, the line 5 for cutting the object 1 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is converged. The line 5 may be curved instead of being straight and may be a line actually drawn on the front face 3 of the object 1 without being restricted to the virtual line. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

The modified region formed by the laser processing device in accordance with this embodiment means regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Further examples of the modified region include an area where the density has changed from that of an unmodified region in a material of the object and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (fissure or microcrack) therewithin or at an interface between the modified region and an unmodified region. The incorporated fracture may be formed over the whole surface of the modified region or in only a part or a plurality of parts thereof.

The laser processing method in accordance with this embodiment will now be explained in detail.

Figure 7:
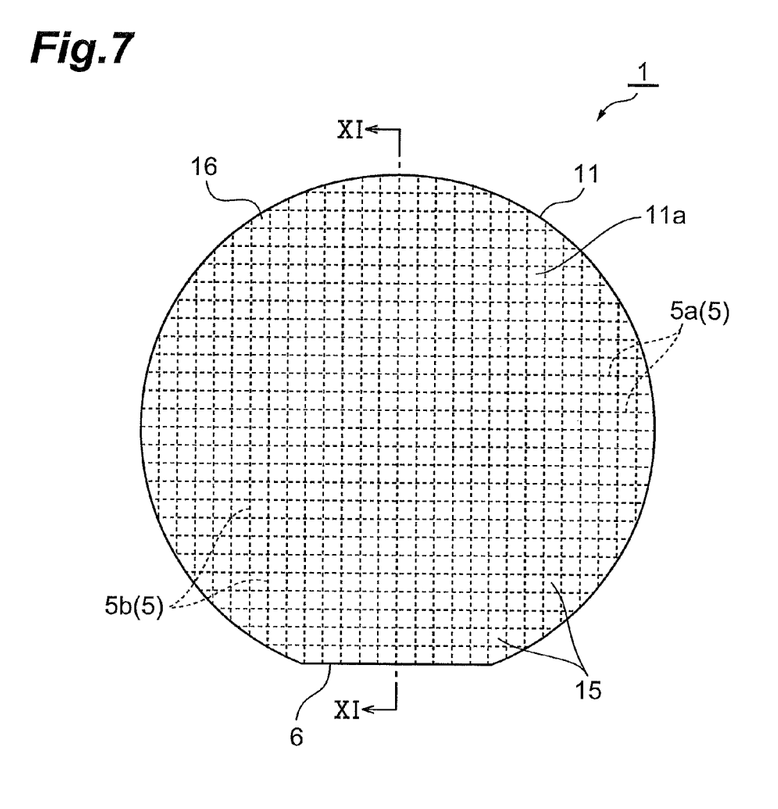
FIG. 7 is a plan view illustrating the object in the laser processing method in accordance with the embodiment.

The laser processing method in accordance with this embodiment performs the thin fine chip processing, for example, while the target object 1 comprises, as illustrated in FIG. 7, a silicon wafer 11 and a functional device layer 16 formed on a front face 11a of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed into a matrix in directions parallel and perpendicular to an orientation flat 6 of the silicon wafer 11.

The object 1 has a thickness of 100 μm, for example, while grid-like lines to cut 5 passing between the functional devices 15 adjacent to each other are set in the object 1. That is, the lines 5 include lines to cut (first lines to cut) 5a extending in one direction and lines to cut (second lines to cut) 5b extending along a direction orthogonal to (intersecting) the lines 5a.

First, in the laser processing method of this embodiment, an expandable tape is attached to the rear face 21 of the object 1, and the object 1 is mounted on the support table 107. Then, the object 1 is irradiated with the laser light L moving back and forth along the lines 5a, while using the front face (one main face) 3 of the object 1 as the laser light entrance surface and causing the condenser lens 105 to locate the converging point P within the object 1.

Figure 8:
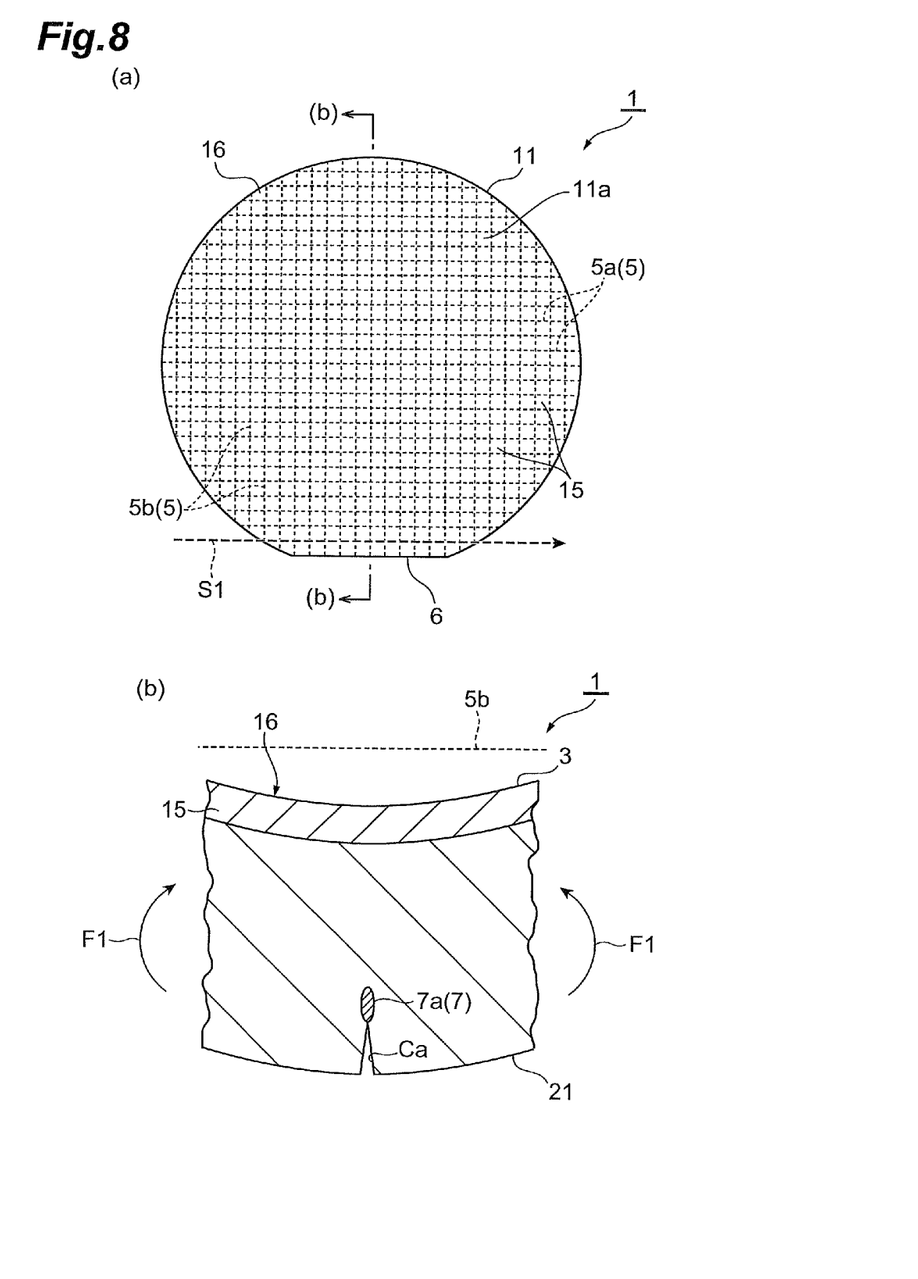
FIG. 8 is a flow diagram for explaining the laser processing method in accordance with the embodiment.

Specifically, as illustrated in FIG. 8(a), the object 1 is irradiated with the laser light L along a line to cut 5a in the direction of depicted arrow S1, so as to form a modified region (first modified region) 7a at a position deep from the front face 3 (on the rear face 21 side) within the object 1. This forms a fracture Ca extending from the modified region 7a to the rear face (the other main face) 21 as illustrated in FIG. 8(b). This fracture Ca is also referred to as backside half cut.

Figure 9:
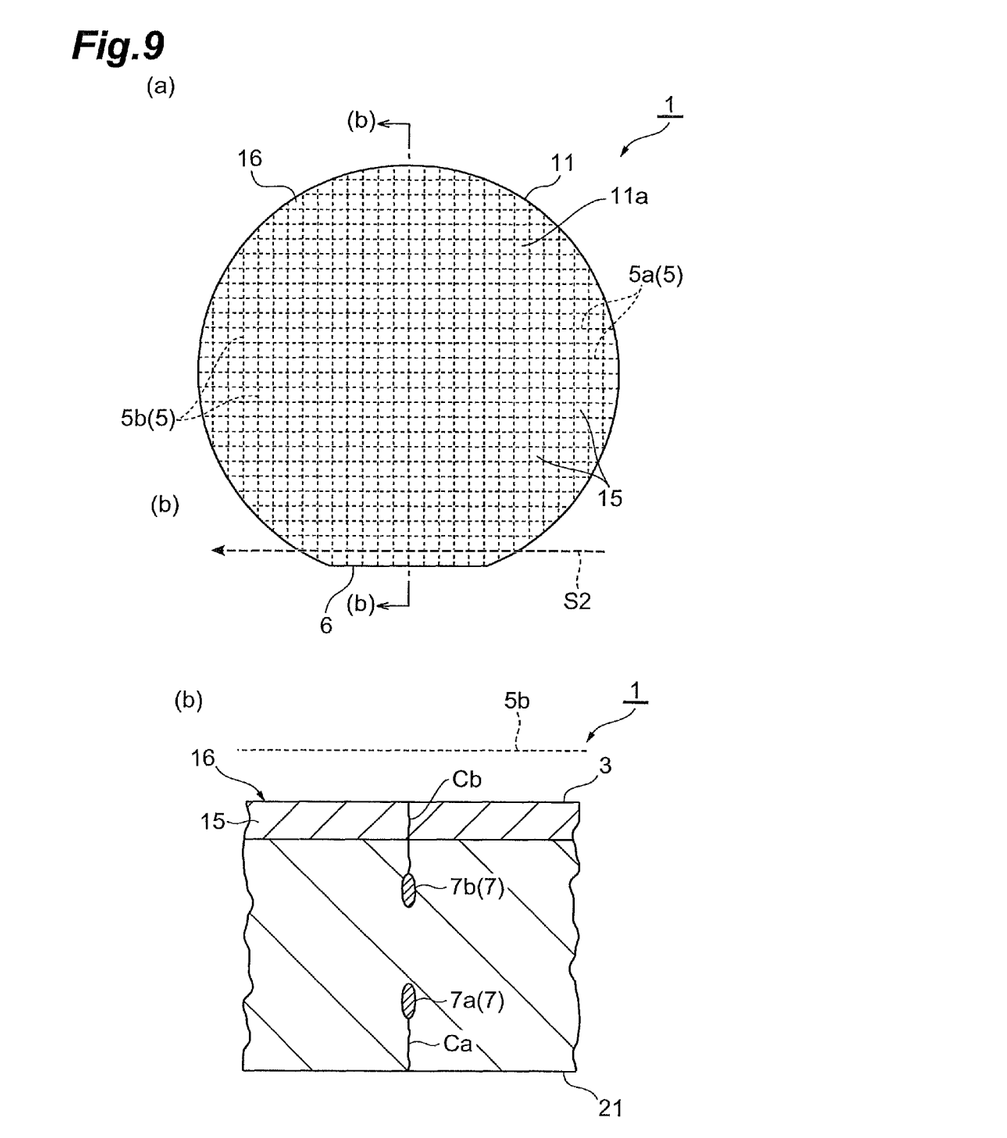
FIG. 9 is a view illustrating a sequel to FIG. 8.

Thereafter, as illustrated in FIG. 9(a), the object 1 is irradiated with the laser light L along the line 5a in the direction of depicted arrow S2, so as to form a modified region 7b (second modified region) between the front face 3 and the first modified region 7a in the object 1. This generates a fracture Cb extending from the modified region 7b to the front face 3 as illustrated in FIG. 9(b). This fracture Cb is also referred to as half cut.

When forming the modified region 7a, the resulting fracture Ca extends to (reaches) the rear face 21, so that a force F1 for deflecting the object 1 occurs in such a direction as to open the fracture Ca (see FIG. 8(b)). However, the fracture Cb generated from the modified region 7a upon forming the latter releases and cancels out the force F1, thereby keeping the object 1 from deflecting upward and downward (see FIG. 9(b)).

Figure 10:
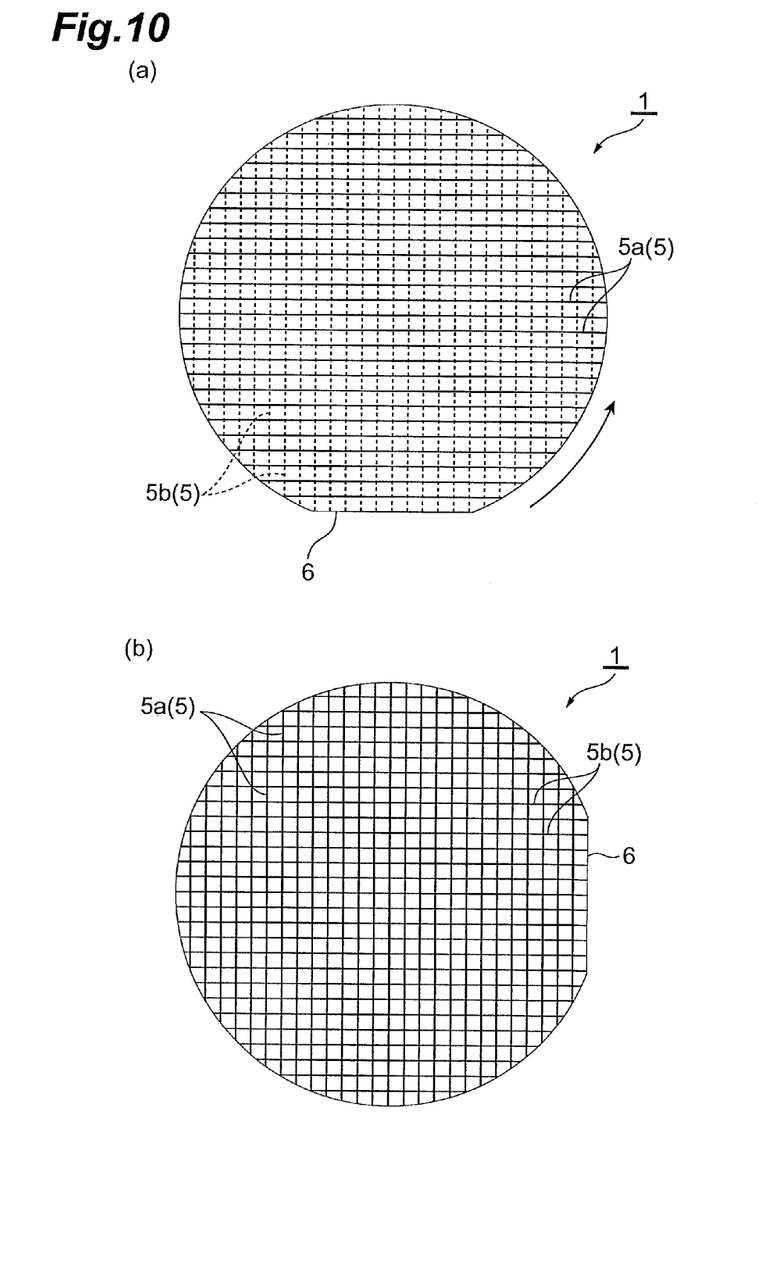
FIG. 10 is a view illustrating a sequel to FIG. 9.
Figure 11:
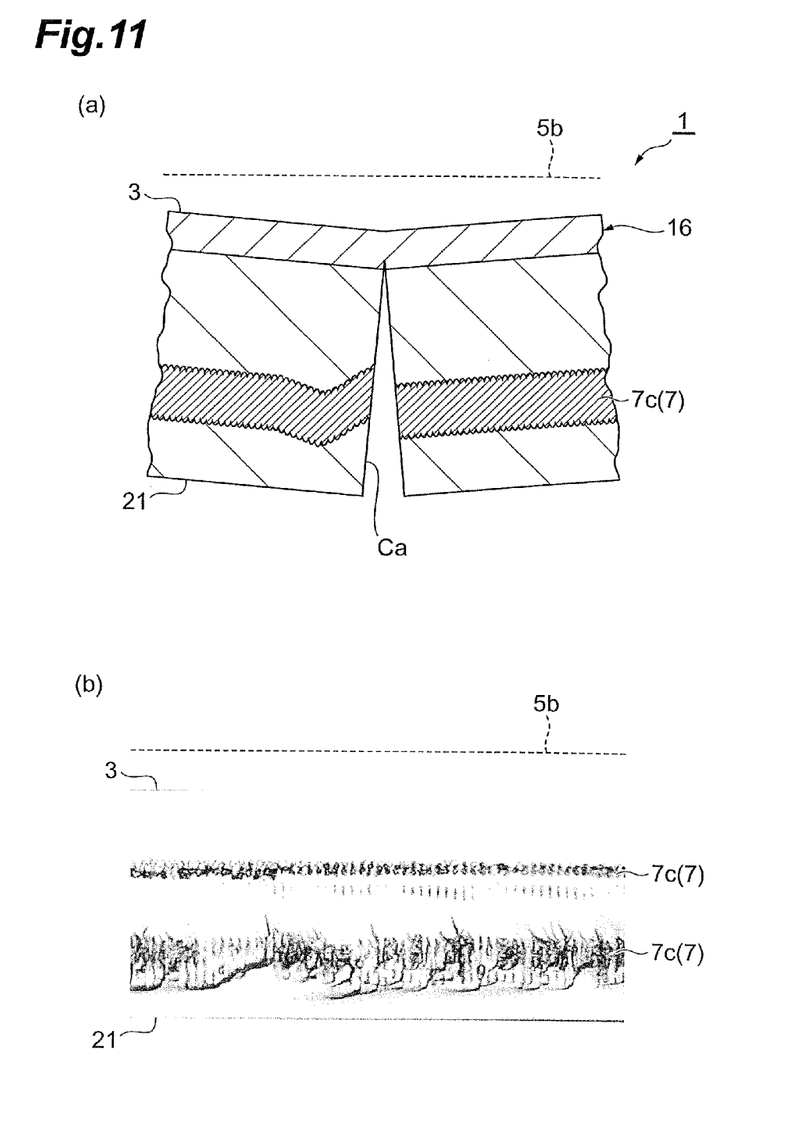
FIG. 11 is a sectional view of the laser-processed object taken along the line XI-XI of FIG. 7.

Subsequently, as illustrated in FIG. 10(a), the above-mentioned modified regions 7a, 7b are formed for all the lines 5a, and thereafter the support table 107 is rotated in the θ direction such that the object 1 revolves by 90°. Then, as illustrated in FIG. 10(b), the object 1 is irradiated with the laser light L moving back and forth along the lines 5b while using the front face 3 of the object 1 as a laser light entrance surface and causing the condenser lens 105 to locate the converging point P within the object 1, so as to form two rows of modified regions (third modified regions) 7c, 7c (see FIG. 11(b)) in the thickness direction within the object 1. The support table 107 may be moved along each of the lines 5a, 5b instead of being rotated in the θ direction.

Finally, the expandable tape is expanded, so as to cut the object 1 into the functional devices 15 along the lines 5 from the modified regions 7 acting as a cutting start point. This yields a plurality of fine semiconductor chips each having a chip size of 0.5 mm×0.5 mm, for example.

Figure 13:
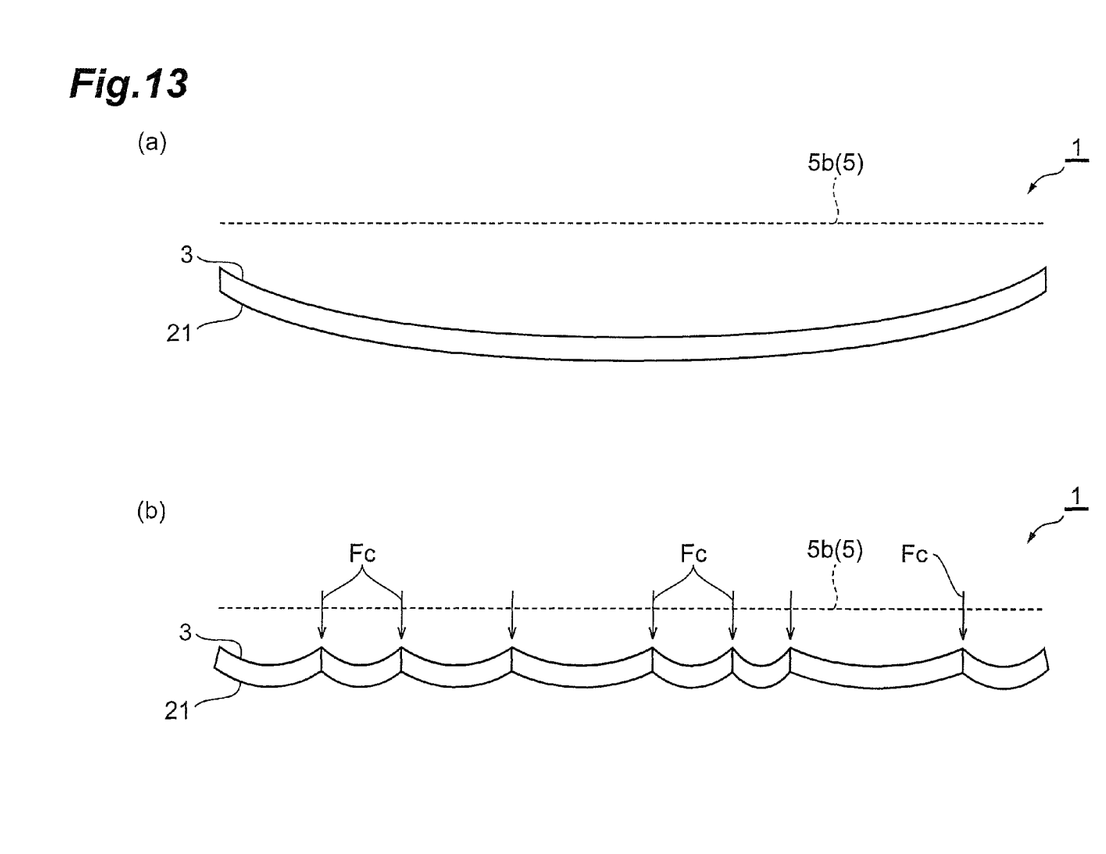
FIG. 13 is a side view illustrating an object laser-processed by a laser processing method not employing the present invention.

Meanwhile, a laser processing method not employing the present invention (hereinafter referred to as "comparative laser processing") irradiates the object 1 with the laser light L along the line 5a so as to form the modified region 7 in the object 1 and generate the fracture Ca extending from the modified region 7 to the rear face 21 alone. Therefore, the object 1 may deform so as to deflect upon irradiation with the laser light L along the line 5b as illustrated in FIG. 13(a). In particular, as mentioned above, the object 1 has the expandable tape attached thereto and is attracted by suction to the stage 111. Therefore, the object 1 may deform so as to undulate at short pitches because of its small chip size, thereby generating unintentional full cuts partly in the object 1 (e.g., at positions of arrows Fc).

As a result, undulations with small pitches exist on the front face 3 of the object 1 upon irradiation with the laser light L along the line 5b in the comparative laser processing, so that autofocus units for controlling the position of the converging point P of the laser light L by following the front face 3 of the object 1 may fail to function favorably, thereby worsening the positional accuracy in forming the modified region 7c (shifting the forming position). Consequently, expanding the expandable tape may fail to cut the object 1 accurately.

By contrast, as mentioned above, the laser processing method in accordance with this embodiment forms the modified region 5a by irradiation with the laser light L along the line 5a, and then forms the modified region 7b between the front face 3 and the first modified region 7a in the object 1 and generates the fracture Cb extending from the modified region 7b to the front face 3 by irradiation with the laser light L along the line 5a again. Therefore, the above-mentioned deflecting force F1 occurring when forming the modified region 7a can be released and canceled out by the fracture Cb. Hence, the object 1 can be inhibited from deflecting, deforming into undulations, and partly generating full cuts against intentions.

As a result, during the irradiation with the laser light L along the line 5b, the laser processing method of this embodiment allows the autofocus unit to follow the front face 3 accurately and thus can raise the positional accuracy in forming the modified regions 7c. Therefore, expanding the expandable tape can accurately cut the object 1. Here, it is important for the modified regions 7 to be formed under such a condition that no full cuts occur (i.e., the cutting has not been completed) immediately after forming the modified region 7b after forming the modified region 7a.

When full cuts can be restrained from occurring, the following problems caused by the partial occurrences of full cuts can be solved. That is, problems of index shifts that the resulting modified region 7 shifts from the line 5 and the like can be solved. It can also solve the problem that, when the expandable tape is expanded, the force is not favorably applied to the object 1, whereby accurate cutting is difficult.

FIG. 11 is a sectional view of the laser-processed object taken along the line XI-XI of FIG. 7. FIG. 11(a) illustrates the object processed by the comparative laser processing, while FIG. 11(b) illustrates the object processed by the laser processing method of this embodiment. As illustrated in FIG. 11, it can be seen that the modified regions 7c are formed at correct depths in this embodiment, while the depth at which the modified region 7c is formed shifts in the comparative laser processing.

As in the foregoing, this embodiment can inhibit the object 1 from deflecting and deforming into undulations. Such operations and effects are remarkable in particular when performing the thin fine chip processing as in this embodiment, since the lines 5 adjacent to each other are set at such a very narrow pitch that the object 1 is likely to deflect and deform into undulations.

As explained above, this embodiment is so-called front illumination, by which the modified region 7a is formed in the object 1 upon irradiation with the laser light L from the front face 3 side, and generates the fracture Ca extending from the modified region 7a to the rear face 21. In the case of such laser processing by the front illumination, generating the fracture Ca extending to the rear face 21 can cut the object easily and accurately. In the case of performing the thin fine chip processing as in this embodiment, a condition under which the object 1 is easy to cut is necessary in particular, whereby the above-mentioned effects by the fracture Ca are effective.

As explained in the foregoing, this embodiment forms both of the fractures Ca, Cb extending to the rear face 21 and front face 3, respectively, in the object 1 and thus can straighten the end parts on the front face 3 side and rear face 21 side in a cut surface, so as to reduce the occurrence of so-called skirts and enhance the quality.

Figure 12:
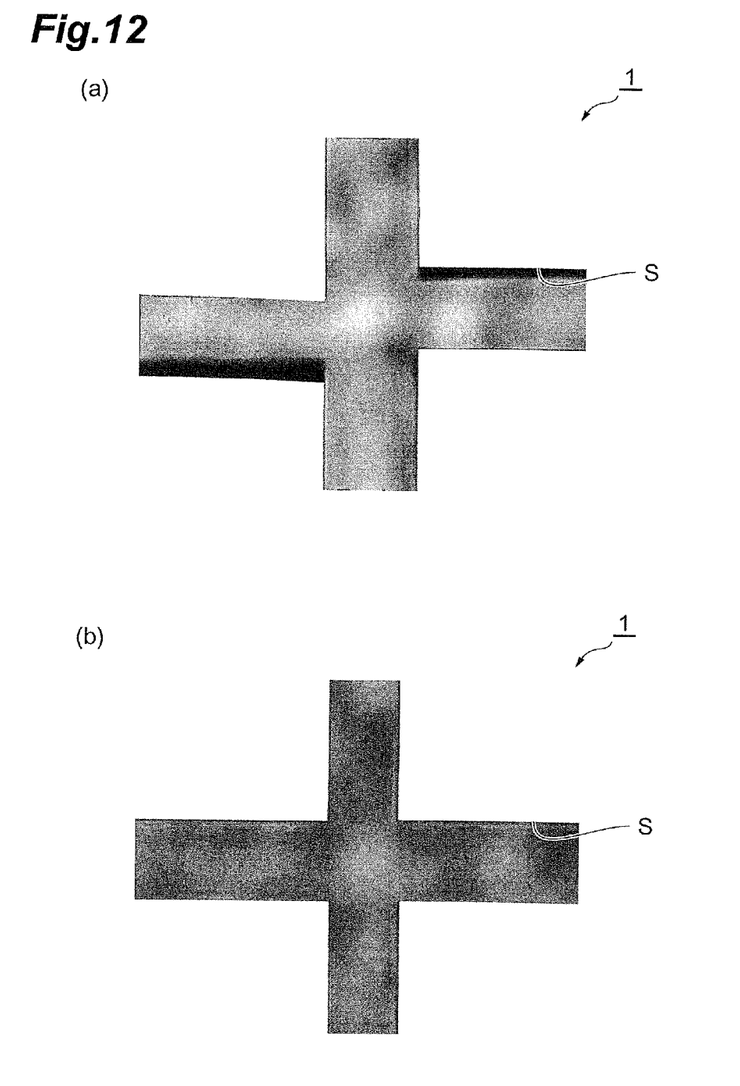
FIG. 12 is an enlarged plan view of the laser-processed object.

FIG. 12 is an enlarged plan view of the laser-processed object. FIG. 12(a) illustrates the object processed by the comparative laser processing, while FIG. 12(b) illustrates the object processed by the laser processing method of this embodiment. As illustrated in FIG. 12, it can be seen that, as compared with the comparative laser processing, this embodiment can straighten a cut surface S and reduce the occurrence of skirts.

For restraining the object 1 from deflecting, the modified region 7a may be formed alone so as to produce fractures extending from the modified region 7a to the front face 3 and rear face 21 (achieve a full cut). However, it is difficult for the thin fine chip processing to form the modified region 7a so as to achieve a full cut from the viewpoint of controlling quality and linearity, for example. Therefore, this embodiment can be considered effective in particular in this point as well.

Though a preferred embodiment of the present invention has been explained in the foregoing, the present invention is not limited to the above-mentioned embodiment. For example, though the above-mentioned embodiment performs front illumination in which the laser light L enters from the front face 3 acting as the laser light entrance surface, back illumination in which the laser light L enters from the rear face 21 acting as the laser light entrance surface may be performed.

When the laser light enters from the rear face 21 side for example, the laser light L is made incident on the object 1 from the rear face 21 thereof while the front face (device surface) 3 of the object 1 is protected by a protective member, so as to form the first and second modified regions on the front face 3 side and rear face 21 side, respectively. After forming the modified regions, an expandable tape is attached to the rear face 21 of the object 1, the protective member is peeled off, and then the expandable tape is expanded, so as to sever and separate the object 1 into chips. In the case of such a back illumination system, it is necessary to generate a fracture reaching the rear face 21 side by forming the second modified region in order to cut the object 1 favorably. However, the second modified region and fracture by themselves may cause the object 1 to deflect or deform into undulations. In this regard, as mentioned above, the present invention forms the first modified region on the front face 3 side and thus can prevent the object 1 from deflecting and deforming into undulations. This makes it unnecessary to generate a fracture extending from the first modified region formed on the front face 3 side of the object 1 to the front face 3.

Though the above-mentioned embodiment forms the modified region 7a as the first modified region within the object 1, so as to generate the fracture Ca, and then forms the modified region 7b as the second modified region, so as to generate the fracture Cb, the modified region 7b may be formed as the first modified region, so as to generate the fracture Cb, and then the modified region 7a may be formed as the second modified region, so as to generate the fracture Ca. In this case, the rear face 21 and the front face 3 construct one main face and the other main face, respectively.

Though the above-mentioned embodiment irradiates the object 1 with the laser light L moving back and forth along the line 5b, so as to form two rows of modified regions 7c in the thickness direction within the object 1, the modified region 7c may be formed by one row alone.

When converging the laser light L at a position deep from the laser light entrance surface where the laser light L is incident in the object 1 that is thick, the laser light L can be utilized effectively at the converging point P if the transmittance of the object 1 is raised. Examples of the object 1 include those containing or constituted by silicon, glass, $LiTaO_3$, and sapphire ($Al_2O_3$).

INDUSTRIAL APPLICABILITY

The present invention can inhibit the object from deflecting.

REFERENCE SIGNS LIST

1 . . . object to be processed; 3 . . . front face (one main face; laser light entrance surface); 5a . . . line to cut (first line to cut); 5b . . . line to cut (second line to cut); 7a . . . modified region (first modified region); 7b . . . modified region (second modified region); 7c . . . modified region (third modified region); 15 . . . functional device; 21 . . . rear face (the other main face); Ca, Cb . . . fracture; L . . . laser light; P . . . converging point

The invention claimed is:

1. A laser processing method of irradiating a sheet-like object to be processed with laser light while locating a converging point within the object so as to form a modified region in the object, the method comprising:
a first step of forming a first modified region as the modified region along a first line to cut in the object; and
a second step of forming a second modified region as the modified region along the first line to cut between one main face and the first modified region in the object, so as to generate a fracture extending from the second modified region to the one main face after forming the first modified region,
wherein the second step forms the second modified region so as to generate the fracture extending from the second modified region to the one main face such that the object is inhibited from partly generating full cuts by the method further comprising:
forming a second fracture extending from the first modified region to another main face,
wherein a modified region is not formed between the first modified region and the second modified region, and a full cut is thus not generated along the entire length of the first line to cut, resulting in a deflecting force being cancelled out; and
forming a third modified region as the modified region along a second line to cut intersecting orthogonal to the said first line to cut; and
subsequently separating the object into chips.

2. A laser processing method according to claim 1, further comprising a third step of forming a third modified region as the modified region along a plurality of second lines to cut orthogonal to the first line after forming the second modified region.

3. A laser processing method according to claim 1, wherein the one main face is a laser light entrance surface, while the object includes a functional device disposed on the one main face side; and
wherein the first step forms the first modified region, so as to generate a fracture extending from the first modified region to the other main face of the object.

4. A laser processing method according to claim 1, wherein the object includes a plurality of functional devices disposed in a matrix on the one main face side and an other main face side;
wherein the first line to cut is set multiply, and extend so as to pass between the functional devices adjacent to each other along a one direction; and
wherein the first and second steps are performed on each of the plurality of first lines.

5. A laser processing method according to claim 1, wherein the one main face is a laser light entrance surface, while the object includes a functional device disposed on the other main face side; and
wherein the first step forms the first modified region, so as to generate a fracture extending from the first modified region to the other main face of the object.

6. A laser processing method according to claim 1, wherein the second step forms the second modified region to generate the fracture extending from the second modified region to the one main face of the object such that a deflecting force occurring when forming the first modified region of the object is cancelled out.

7. A laser processing method according to claim 1, wherein the first step forms the first modified region in the other main face side of the object.

8. A laser processing method according to claim 1, wherein the object is mounted on a support table and attracted by suction.

* * * * *